(12) United States Patent
Matsumoto et al.

(10) Patent No.: US 10,233,030 B2
(45) Date of Patent: Mar. 19, 2019

(54) COMPONENT STORAGE MEMBER AND STORAGE METHOD

(71) Applicant: FUJI CORPORATION, Chiryu-shi (JP)

(72) Inventors: Toru Matsumoto, Okazaki (JP); Shunji Morikawa, Toyoake (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/533,055

(22) PCT Filed: Dec. 11, 2014

(86) PCT No.: PCT/JP2014/082787
§ 371 (c)(1),
(2) Date: Jun. 5, 2017

(87) PCT Pub. No.: WO2016/092658
PCT Pub. Date: Jun. 16, 2016

(65) Prior Publication Data
US 2017/0341874 A1 Nov. 30, 2017

(51) Int. Cl.
*B65G 47/14* (2006.01)
*B65G 47/91* (2006.01)
(Continued)

(52) U.S. Cl.
CPC ............. *B65G 47/14* (2013.01); *B65G 47/91* (2013.01); *H05K 13/0069* (2013.01);
(Continued)

(58) Field of Classification Search
CPC ...... B65G 47/14; B65G 47/91; B65G 47/902; B65G 47/914; H05K 13/0015;
(Continued)

(56) References Cited

U.S. PATENT DOCUMENTS 4,733,462 A * 3/1988 Kawatani ............. H05K 3/0008
228/49.1
5,263,583 A 11/1993 Ohashi
(Continued)

FOREIGN PATENT DOCUMENTS

JP    56-70212 A    6/1981
JP    56-78387 U    6/1981
(Continued)

OTHER PUBLICATIONS

International Search Report dated Feb. 10, 2015, in PCT/JP2014/082787, filed Dec. 11, 2014.
(Continued)

*Primary Examiner* — William R Harp
(74) *Attorney, Agent, or Firm* — Oblon, McClelland, Maier & Neustadt, L.L.P.

(57) ABSTRACT

For a component receiving member provided with a component reception recess shaped according to a component that is a storage target, and side wall section that a component held by suction nozzle contacts when moved in the left-right direction, when the component is released in a state contacting the side wall section, the component is stored in the component reception recess by leads of the component falling along a tapered surface and the component rotating 90 degrees due to its own weight. Therefore, even in a case in which the component is held by suction nozzle with an upper surface facing up, the component is stored in the component reception recess with the upper surface facing up by the component rotating 90 degrees at the component receiving member.

3 Claims, 12 Drawing Sheets

(51) Int. Cl.
*H05K 13/00* (2006.01)
*H05K 13/02* (2006.01)
*H05K 13/04* (2006.01)

(52) U.S. Cl.
CPC ....... *H05K 13/0084* (2013.01); *H05K 13/021* (2013.01); *H05K 13/022* (2013.01); *H05K 13/028* (2013.01); *H05K 13/0434* (2013.01)

(58) Field of Classification Search
CPC ............ H05K 13/022; H05K 13/0069; H05K 13/028; H05K 13/021
USPC ...................................................... 198/468.5
See application file for complete search history.

(56) References Cited

U.S. PATENT DOCUMENTS

| | | | | |
|---|---|---|---|---|
| 6,259,247 B1* | 7/2001 | Bannai | ................... | G01R 31/01 324/750.03 |
| 6,449,531 B1* | 9/2002 | Gune | ................... | H05K 13/021 700/218 |
| 9,422,117 B2* | 8/2016 | Sano | ...................... | B65G 47/14 |
| 2017/0081132 A1* | 3/2017 | Harada | ................. | B65G 47/14 |

FOREIGN PATENT DOCUMENTS

| | | |
|---|---|---|
| JP | 6-82897 U | 11/1994 |
| JP | 2011-14735 A | 1/2011 |

OTHER PUBLICATIONS

Extended European Search Report dated Feb. 19, 2018 in corresponding European Patent Application No. 14907762.0 citing documents AA, AO and AP therein, 7 pages.

Japanese Office Action dated Sep. 19, 2018 in Patent Application No. 2016-563344, citing document AO therein, 5 pages (submitting unedited computer generated English translation only).

* cited by examiner

COMPONENT STORAGE MEMBER AND STORAGE METHOD

TECHNICAL FIELD

The present application relates to a component storage member and a storage method for storing a component that is a storage target in a storage recess.

BACKGROUND ART

A component storage member is provided with a storage recess with a shape corresponding to a component that is a storage target, and the component is stored in the storage recess. Because the orientation of the component stored in the storage recess depends on the component, a component that is a target for storage must be stored in a storage recess with a defined orientation. For example, in a case in which a specified surface of a component is defined to be the upper surface, the component must be stored in the storage recess with the upper surface facing up. Disclosed in the patent literature below is technology for storing a component that is a target for storage in a storage recess with a defined orientation using two component storage members and a jig.
Patent Literature 1: JP-A-2011-14735

SUMMARY

According to technology disclosed in the above patent literature, it is possible to store a component that is a target for storage in a storage recess with a defined orientation. However, according to the technology disclosed in the above patent literature, multiple component storage members and jigs are required, so the usability is poor and it is not possible for the component storage members to store components easily. Also, many members must be prepared, which is wasteful. That is, the practicality is poor when storing a component with a component storage member using the technology disclosed in the above patent literature. An object of the present disclosure is to provide a highly practical component storage member and storage method that takes account of the above circumstances.

To solve the above problems, a disclosed component storage member includes: a storage recess with a shape corresponding to a component that is a storage target; and a contacting section configured to contact the component held by a component holding tool when the component is moved in a left-right direction; wherein, in a case in which the holding of the component being held by the component holding member is released in a state with the component being held by the component holding member contacted by the contacting section, by the component falling along at least a portion of a surface that goes from the contacting section to a bottom surface of the storage recess, the component rotates 90 degrees due to its own weight and is stored in the storage recess.

To solve the above problem, a disclosed storage method is: a storage method of storing a component in a component storage member provided with a storage recess shaped corresponding to the component that is a target for storage, the storage method including: holding the component with a component holding tool, the component being loaded on a loading stand in a state with a specified surface being contacted; pivoting the component held by the component holding tool by 90 degrees in a vertical direction using a pivoting mechanism of the component holding tool; contacting the specified surface of the component held by the component holding tool against a contacting member, the contacting member being perpendicular to a bottom surface of the storage recess of the component storage member; and storing the component in the storage recess with the specified surface facing up after rotating the component 90 degrees due to its own weight by releasing the holding of the component by the component holding tool in a state with the contacting section contacting the specified surface such that the component falls along at least a portion of a surface from the contacting member to the bottom surface of the storage recess.

With the disclosed component storage member and storage member, the component storage member is provided with a storage recess and a contacting section configured to contact the component held by a component holding tool when the component is moved in the left-right direction. Also, in a case in which the component being held by the component holding tool is separated from the component holding tool in a state contacting the contacting section, the component, by falling along at least a portion of a surface that goes from the contacting section to a bottom surface of the storage recess, rotates 90 degrees due to its own weight and is stored in the storage recess. That is, by forming a contacting section on the component storage member and forming at least a portion of a surface that goes from the contacting section to the bottom surface of the storage recess as a specified shape, for example, even in a case in which a component that is a storage target is held by a component holding tool with the upper surface facing to the side, by the component being rotated 90 degrees at the component storage member, the component is stored in the storage recess with the upper surface facing up. In other words, with the disclosed component storage member and storage method, it is possible to easily store a component in a storage recess, without needing to use a tool or the like, by slightly changing the shape of the component storage member. This improves the practicality of a component storage member and a storage method.

DESCRIPTION OF PREFERRED EMBODIMENTS

The following describes in detail referring to the figures an example embodiment.

Configuration of Component Mounter

Figure 1:
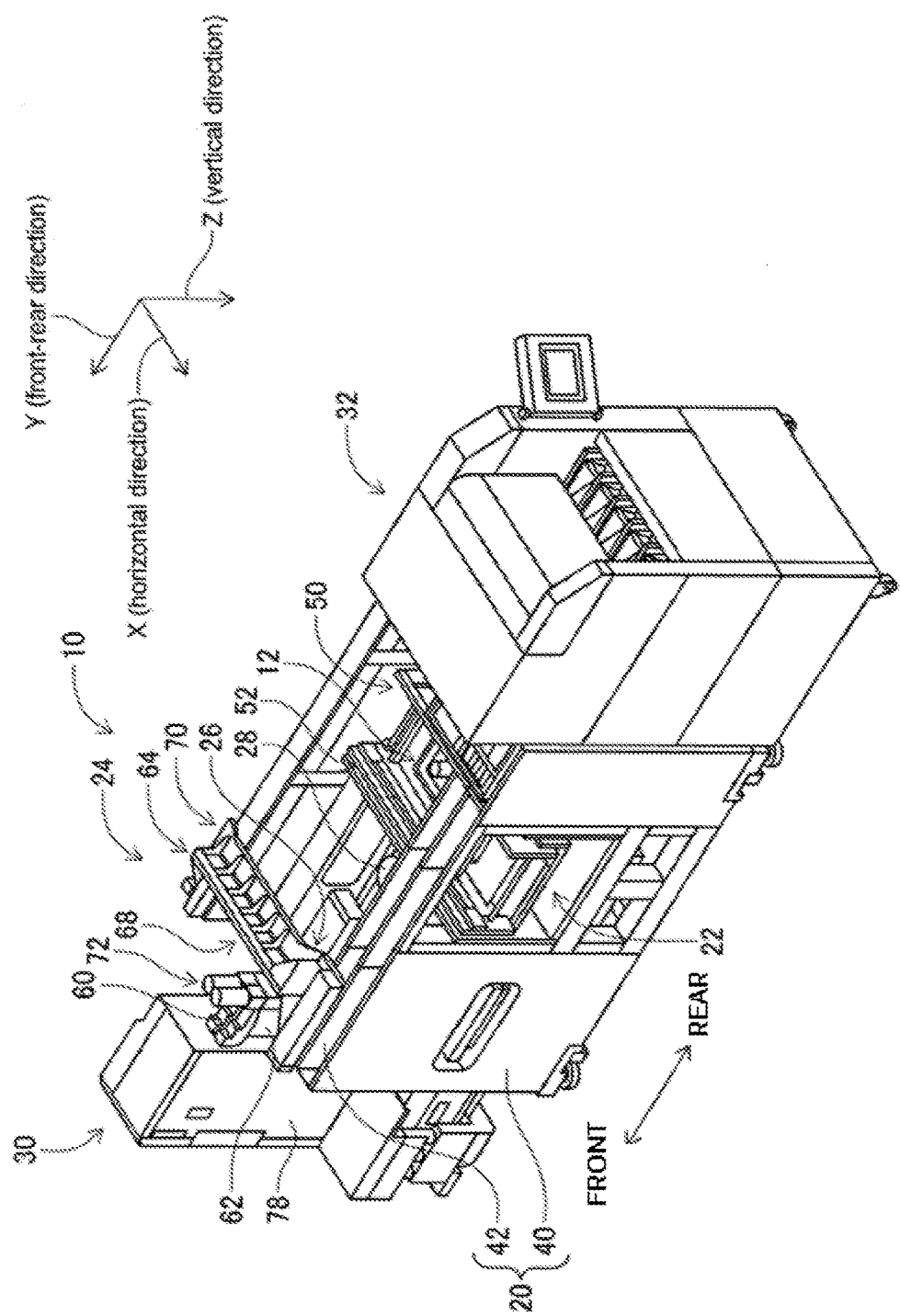
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, imaging devices 26 and 28, component supply device 30, and loose component supply device 32. Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
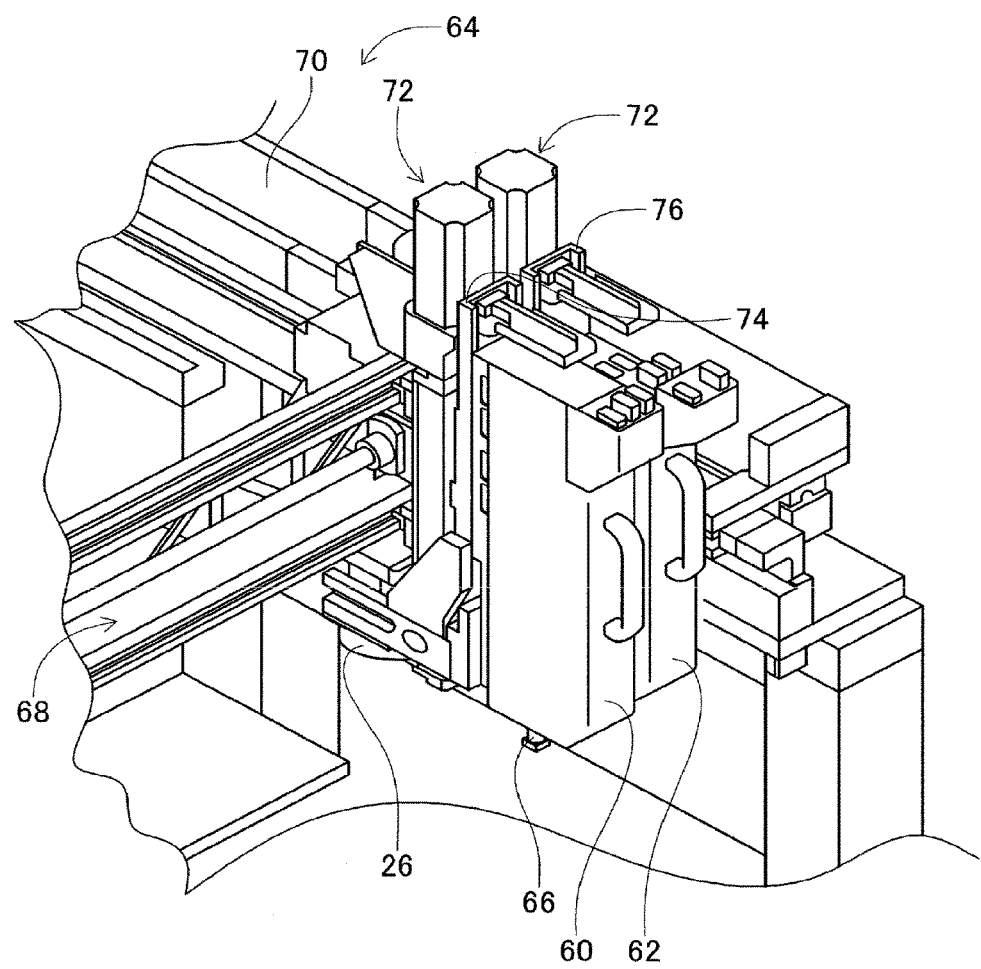
FIG. 2 is a perspective view of a component mounting device of the component mounter.

Component mounting device 24 is provided on beam section 42, and includes work heads 60 and 62 and work head moving device 64. Each work head 60 and 62 includes holding tool (refer to FIG. 2) 66 such as a chuck or suction nozzle, and holds a component using holding tool 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, as shown in FIG. 2, work head 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Imaging device 26 is attached to slide 74 in a state facing downwards, and is moved in the X direction, Y direction, and Z direction together with work head 60. Thus, imaging device 26 images any position on frame section 40. As shown in FIG. 1, imaging device 28 is provided in a state facing upwards on frame section 40 between board conveying and holding device 22 and component supply device 30. Thus, imaging device 28 images a component held by component holding tool 66 of work heads 60 and 62.

Component supply device 30 is provided at an end of frame section 40 in the front-rear direction. Component supply device 30 includes tray-type component supply device 78 and feeder-type component supply device (not shown). Tray-type component supply device 78 supplies components in a state arranged in a tray. The feeder-type component supply device supplies components via a tape feeder (not shown) or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. The configuration of component supply device 32 is described below in detail. Note that, components supplied by component supply device 30 and loose component supply device 32 may include electronic circuit components, configuration components of solar panels, configuration components of power modules, and the like. Also, electronic circuit components include components with leads and components without leads.

Figure 3:
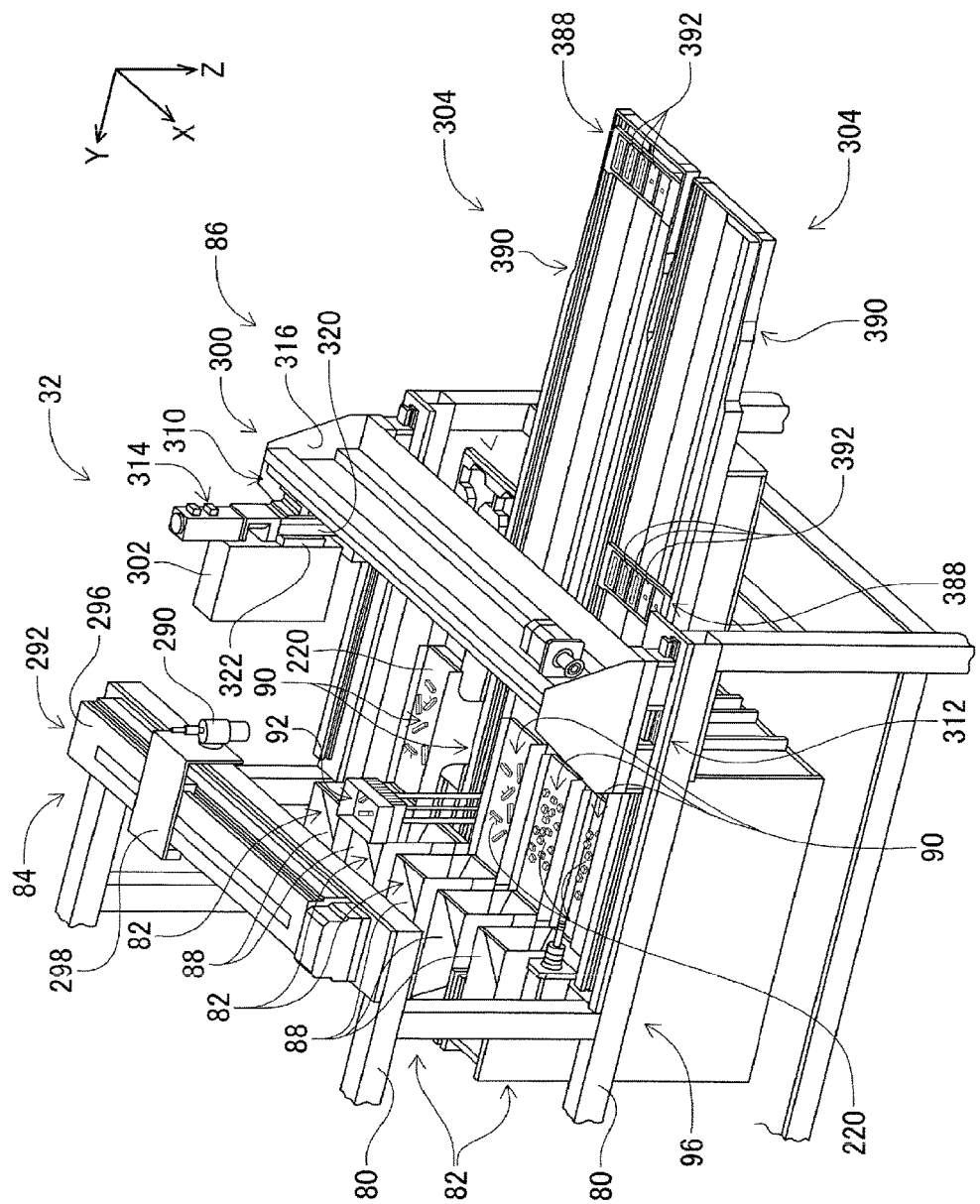
FIG. 3 is a perspective view of a loose component supply device.

As shown in FIG. 3, loose component supply device 32 includes main body 80, component supply unit 82, imaging device 84, and component transfer device 86.

(a) Component Supply Unit

Component supply unit 82 includes component supply apparatus 88, component scattering device 90, and component returning device 92, with those supply apparatus 88, component scattering device 90, and component returning device 92 configured to be integrated as one. Component supply unit 82 is assembled to be removable from base 96 of main body 80, and with loose component supply device 32, five component supply units 82 are arranged in one row in the X direction.

(i) Component Supply Apparatus

Figure 4:
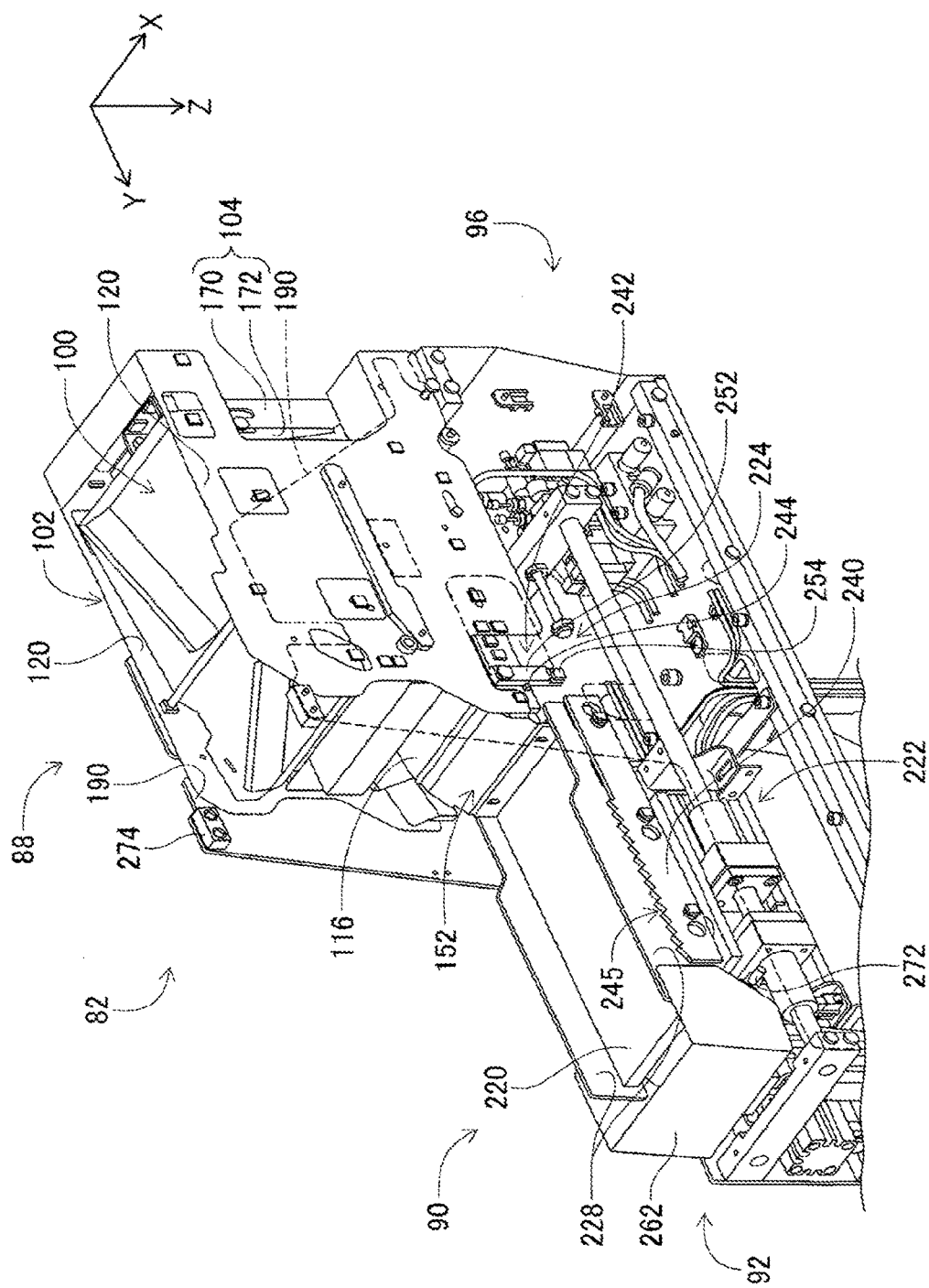
FIG. 4 is a perspective view of a component supply unit.

As shown in FIG. 4, component supply apparatus 88 includes component storage apparatus 100, housing 102, and grip 104. Component storage apparatus 100 has a general shape of a rectangular parallelepiped and is open at the top surface and a front surface. The bottom surface of component storage apparatus 100 is inclined surface 116, which is inclined towards the open front surface of component storage apparatus 100.

Housing 102 includes pair of side walls 120, and component storage apparatus 100 is swingably held between the pair of side walls 120. Also, inclined plate 152 is fixedly arranged between the pair of side walls 120 so as to be positioned in front of the lower end of the front surface of component supply apparatus 100. Inclined plate 152 is inclined downwards towards the front side.

Grip 104 is arranged on the rear end of housing 102 and is configured from fixed holding member 170 and movable holding member 172. Movable holding member 172 is able to move towards and away from fixed holding member 170. Also, movable holding member 172 is connected to the rear surface of component storage apparatus 100 by a connecting arm (not shown). By this, by gripping grip 104, movable holding member 172 is moved towards and away from fixed holding member 170, and component storage apparatus 100 swings between the pair of side walls 120.

Also, component supply apparatus 88 is provided between the pair of side frame sections 190 assembled to base 96 and can be attached to and removed from base 96. Note that, a lock mechanism (not shown) is provided on a lower end of movable holding member 172 of grip 104, and the lock mechanism is released by grip 104 being gripped. That is, by an operator raising component supply apparatus 88 in a state gripping grip 104 of component supply apparatus 88, component supply apparatus 88 is removed from the pair of side frame sections 190.

(ii) Component Scattering Device

Component scattering device 90 includes component support member 220, component support member moving device 222, and supply apparatus oscillating device 224. Component support member 220 is a roughly rectangular plate, and is provided to extend forwards from below inclined plate 152 of component supply apparatus 88. Side wall sections 228 are formed at each edge in the lengthwise direction of component support member 220.

Component support member moving device 222 is for moving component support member 220 forwards and backwards by the driving of an electromagnetic motor (not shown). By this, component support member 220 moves forwards and backwards slightly below the lower end of inclined plate 152 of component supply apparatus 88 in a state with the upper surface of component support member 220 horizontal.

Supply apparatus oscillating device 224 includes cam member 240, cam follower 242, and stopper 244. Cam member 240 is roughly a plate and is fixed to an outer side surface of side wall section 228 extending in a front-rear direction. Multiple teeth 245 are formed at regular intervals in the front-rear direction on the upper end section of cam member 240. Cam follower 242 includes lever 252 and roller 254. Lever 252 is provided on the lower end section of side wall 120 of component supply apparatus 88 and is swingable around the upper end section. Roller 254 is held to be rotatable at the lower end section of lever 252. Note that, lever 252 is biased in a direction facing forwards by the elastic force of a coil spring (not shown). Also, stopper 244 is provided protruding from side wall 120, and lever 252 biased by the elastic force of the coil spring contacts stopper 244.

(iii) Component Returning Device

Figure 5:
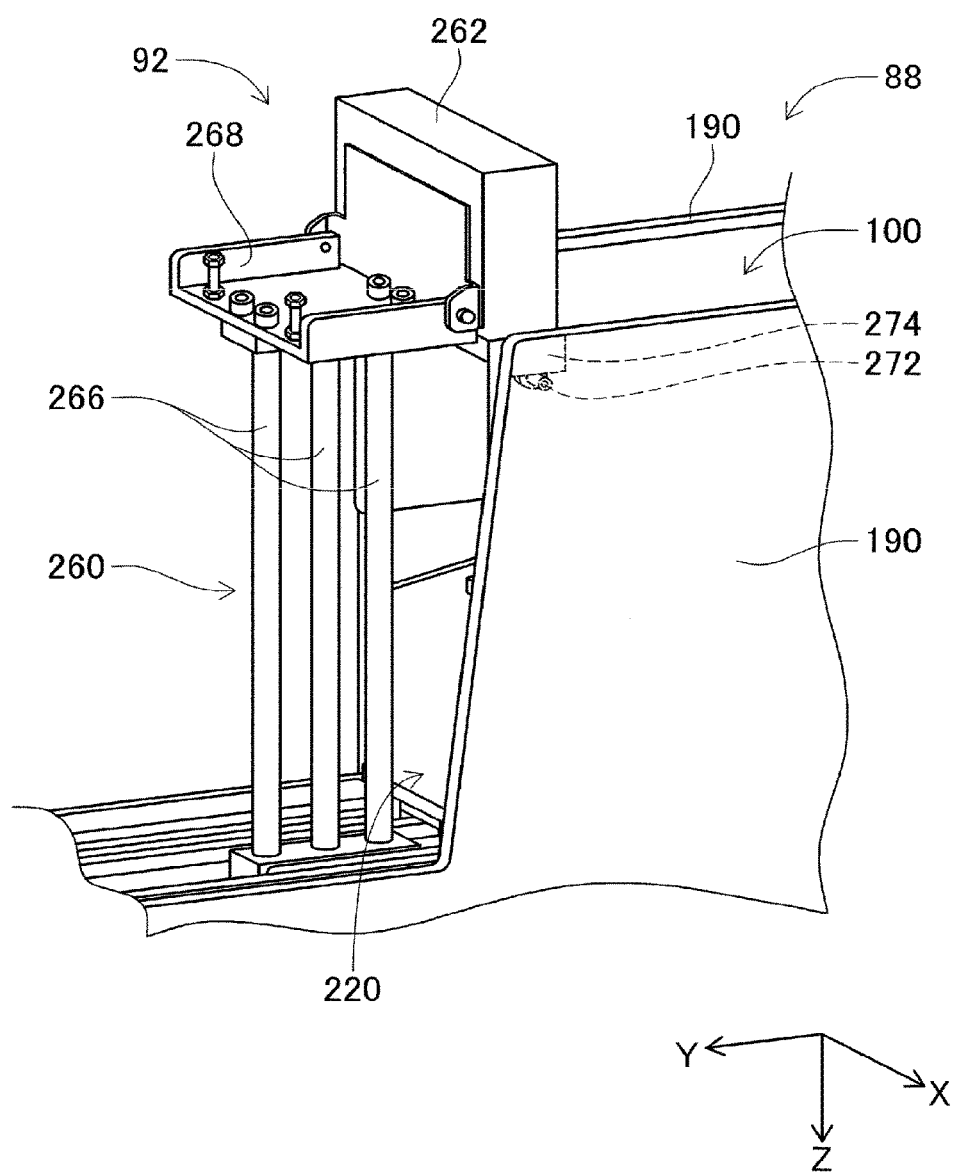
FIG. 5 is a perspective view showing the component supply unit in a state with a component collection container raised to an upper limit position.

As shown in FIG. 5, component returning device 92 includes container raising and lowering device 260, and component collection container 262. Container raising and lowering device 260 includes air cylinder 266 and raising and lowering member 268, and raising and lowering member 268 is raised and lowered by operation of air cylinder 266. Also, air cylinder 266 is fixed to the front side end of component support member 220. Accordingly, air cylinder 266 moves forwards and backwards together with component support member 220 by operation of component support member moving device 222.

Component collection container 262 is provided on the upper surface of raising and lowering member 268 and is moved up and down by operation of air cylinder 266. Component collection container 262 is a box that is open at the end and is rotatably held at the top surface of raising and lowering member 268. As shown in FIG. 4, protruding pin 272 is provided on the rear side end section of component collection container 262. Protruding pin 272 protrudes towards the outside on the side of component collection container 262. Further, engaging block 274 is fixed to the inside of the front side top end section of side frame section 190. Also, as shown in FIG. 5, when component collection container 262 is raised to the raised position by operation of air cylinder 266, protruding pin 272 engages with engaging block 274. By this, component collection container 262 rotates.

(b) Imaging Device

As shown in FIG. 3, imaging device 84 includes camera 290 and camera moving device 292. Camera moving 292 includes guide rail 296 and slider 298. Guide rail 296 is fixed to main body 80 above component supply apparatus 82 so as to extend in the width direction of loose component supply device 32. Slider 298 is slidably attached to guide rail 296, and can be slid to any position by operation of an electromagnetic motor (not shown). Also, camera 290 is attached to slider 298 facing downwards.

(c) Component Transfer Device

As shown in FIG. 3, component transfer device 86 includes component holding head moving device 300, component holding head 302, and two shuttle devices 304.

Component holding head moving device 300 includes X-direction moving device 310, Y-direction moving device 312, and Z-direction moving device 314. Y-direction moving device 312 includes Y slider 316 provided above component supply unit 82 extending in the X direction, and Y slider 316 is moved to any position in the Y direction by operation of an electromagnetic motor (not shown). X-direction moving device 310 includes X slider 320 provided on a side surface of Y slider 316, and X slider 320 is moved to any position in the X direction by operation of an electromagnetic motor (not shown). Z-direction moving device 314 includes Z slider 322 provided on a side surface of X slider 320, and Z slider 322 is moved to any position in the Z direction by operation of an electromagnetic motor (not shown).

Figure 6:
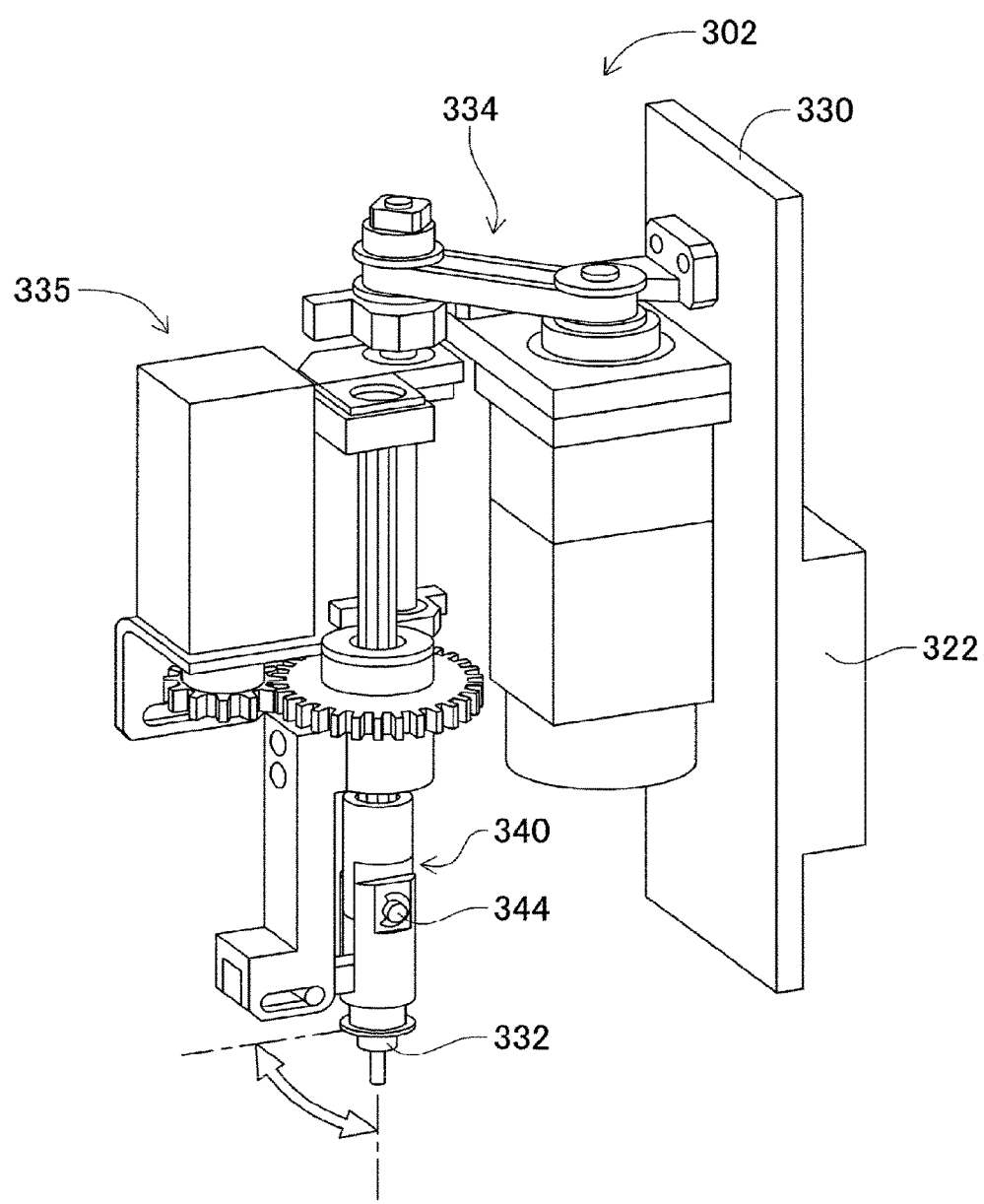
FIG. 6 is a perspective view of a component holding head.

As shown in FIG. 6, component holding head 302 includes head main body 330, suction nozzle 332, nozzle pivoting device 334, and nozzle rotating device 335. Head main body 330 is formed as one body with Z slider 322. Suction nozzle 332 picks up and holds a component using negative pressure and is attached to the lower end of nozzle holder 340. Nozzle holder 340 is able to bend at support shaft 344, and nozzle holder 340 bends 90 degrees in an up direction by operation of nozzle pivoting device 334. By this, suction nozzle 332 attached to the bottom end of nozzle holder 340 is pivoted 90 degrees to be positioned at the pivoted position. That is, suction nozzle 332 is able to be pivoted to and from a non-pivoted position and a pivoted position by operation of nozzle pivoting device 334. Further, nozzle rotating device 335 rotates suction nozzle 332 around its own center axis.

As shown in FIG. 3, each of the two shuttle devices 304 includes component carrier 388, and component carrier moving device 390, and is fixed to main body 80 lined up in the sideways direction on the front side of component supply unit 82. Five component receiving members 392 are attached to component carrier 388 lined up in a single row sideways, and components are loaded on each component receiving member 392.

Figure 7:
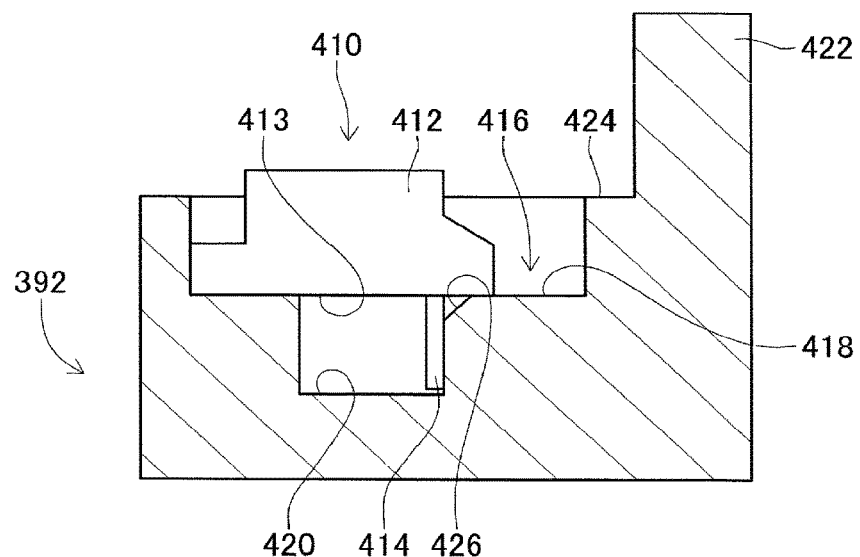
FIG. 7 shows a component receiving member in which is stored a leaded component.

In detail, as shown in FIG. 7, components supplied by loose component supply device 32 are electronic circuit components 410 that have leads (hereinafter also referred to as "leaded components"), being configured from a block-like component main body 412, and multiple leads 414 that protrude from bottom surface 413 of component main body 412. Leaded component 410 is a component with multiple leads 414 lined up on one side of component main body 412, or a so-called SIP (Single Inline Package), and in FIG. 7 leaded component 410 is shown from the viewpoint of the direction in which the leads are lined up. Therefore, only one lead 414 is shown for leaded component 410 of FIG. 7.

Also, component reception recess 416 is formed in component receiving member 392. Component reception recess 416 is a stepped recess configured from main body section reception recess 418 open at the top surface of component receiving member 392, and lead reception recess 420 open at the bottom surface of main body section reception recess 418. Leaded component 410 is inserted inside component reception recess 416 with leads 414 pointing downwards. Therefore, leaded component 410 is loaded inside component reception recess 416 with leads 414 inserted into lead reception recess 420 and component main body 412 inserted into main body section reception recess 418.

Also, side wall section 422 is formed in component receiving member 392 slightly separated from the edge of main body section reception recess 418. Side wall section 422 is formed largely upright in a vertical direction, and step 424 is formed between side wall section 422 and main body section reception recess 418. Further, tapered surface 426 is formed on the edge of lead reception recess 420 on the step 424 side as a continuation of main section reception recess 418, with tapered surface 426 being inclined towards the bottom surface of lead reception recess 420. Note that, side wall section 422, step 424, and tapered surface 426 are used when leaded component 410 is loaded inside component reception recess 416, but details are described later.

Also, as shown in FIG. 3, component carrier moving device 390 is a long plate member provided on the front side of component supply unit 82 extending in the front-rear direction. Component carrier 388 is provided on the upper surface of component carrier moving device 390 to be slidable in the front-rear direction, and is slid to any position in the front-rear direction by operation of an electromagnetic motor (not shown). Note that, component carrier 388, when slid in a direction approaching component supply unit 82, is slid to a component receiving position that is positioned within the movement range of component holding head 302 by component holding head moving device 300. Conversely, when slid in a direction away from component supply unit 82, component carrier 388 is slid to a component supply position that is positioned within the movement range of work heads 60 and 62 by work head moving device 64.

Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, imaging device 26 moves above circuit board 12 and images circuit board 12. By this, information related to a holding position error of circuit board 12 is obtained. Also, component supply device 30 or loose component supply device 32 supplies components at a specified supply position. Component supply by loose component supply device 32 is described in detail later. One of the work heads 60 or 62 moves above the component supply position and holds a component using component holding tool 66. Then, work head 60 or 62 holding the component moves above imaging device 28, and the component being held by component holding tool 66 is imaged by imaging device 28. Accordingly, information related to an error of the holding position of the component is obtained. Next, work head 60 or 62 holding the component moves above circuit board 12, and mounts the held component on circuit board 12 after correcting for the error in the holding position of circuit board 12 and the error in the holding position of the component and so on.

Operation of Loose Component Supply Device
(a) Supply of Leaded Components Using Loose Component Supply Device With loose component supply device 32, leaded components 410 are inserted by an operator into component storage apparatus 100 of component supply apparatus 88, then, the inserted leaded components 410 are supplied in a state loaded on component receiving member 392 of component carrier 388 by operation of component supply unit 82 and component transfer device 86. In detail, the operator inserts leaded components 410 via the entrance in the top surface of component storage apparatus 100 of component supply apparatus 88. Here, component support member 220 is moved below component supply apparatus 88 by operation of component support member moving device 222, and component collection container 262 is positioned in front of component supply apparatus 88.

Leaded components 410 inserted via the entrance on the top surface of component storage apparatus 100 fall onto inclined surface 116 of component storage apparatus 100 and spread out on inclined surface 116. Here, in a case in which leaded components 410 that have fallen onto inclined surface 116 roll and fall beyond inclined plate 152, they are collected in component collection container 262 positioned in front of component supply apparatus 88.

Figure 8:
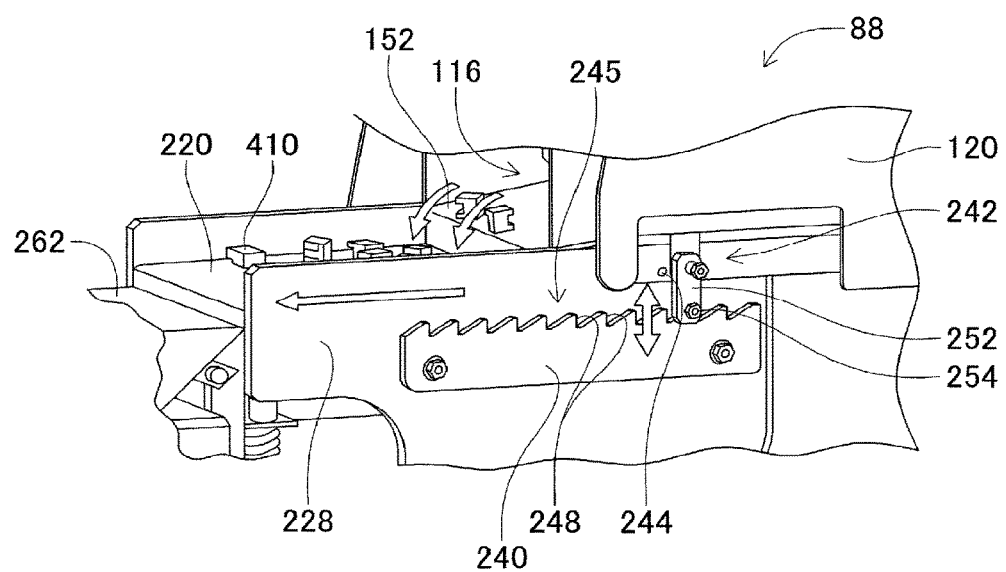
FIG. 8 is a perspective view of a component scattering device.

After leaded components 410 have been inserted into component storage apparatus 100, component support member 220 is moved forwards from below component supply apparatus 88 by operation of component support member moving device 222. Here, as shown in FIG. 8, as cam member 240 engages with cam follower 242, roller 254 of cam follower 242 rides over teeth 245 of cam member 240. Lever 252 of cam follower 242 is biased in a direction facing forwards by the elastic force of a coil spring, with the biasing forward of lever 252 being regulated by stopper 244. Therefore, when component support member 220 is moved forwards, roller 254 and teeth 245 are maintained in an engaged state, and roller 254 rides over teeth 245 without lever 252 being rotated forwards. Here, component supply apparatus 88 is raised by the riding over of teeth 245 by roller 254. That is, with roller 254 engaged with teeth 245, component support member 220 is moved forward, such that roller 254 rides over multiple teeth 245 and component supply apparatus 88 is oscillated by being consecutively moved up and down.

Leaded components 410 spread out on inclined surface 116 of component supply apparatus 100 are moved forwards by the oscillation of component supply apparatus 88 and the incline of inclined surface 116, and are ejected onto the upper surface of component support member 220 via inclined plate 152. Here, leaded components 410 are prevented from falling from component support member 220 by side wall sections 228 of component support member 220. And, by component support member 220 being moved forwards, leaded components 410 are scattered on the upper surface of component support member 220.

When leaded components 410 are scattered on component support member 220, camera 290 of imaging device 88 is moved above component support member 220, on which leaded components 410 are scattered, by operation of camera moving device 292, and images leaded components 410. Then, based on the image data captured by camera 290, a leaded component that is a target for pickup (hereinafter also referred to as "pickup target component") is held by a suction nozzle 332 of component holding head 302.

Specifically, the position of the pickup target component and orientation of the pickup target component are calculated based on the image data of camera 290. Then, based on the calculated position of the pickup target component and orientation of the pickup target component, operation of component holding head moving device 300 is controlled. By this, component holding head 302 moves above the pickup target component and the pickup target component is picked up and held using suction nozzle 332. Note that, when the pickup target component is picked up and held by suction nozzle 332, suction nozzle 332 is in the non-pivoted position.

After leaded component 410 has been picked up by suction nozzle 332, component holding head 302 is moved above component carrier 388, and here, component carrier 388 is moved to the component receiving position by operation of component carrier moving device 390. Also, when component holding head 302 is moved above component carrier 388, suction nozzle 332 is pivoted to the pivoted position. Note that, suction nozzle 332 is rotated by operation of nozzle rotating device 335 such that leads 414 of the leaded component 410 held by suction nozzle 332 that is in the pivoted position face downwards in a vertical direction.

When component holding head 302 is moved above component carrier 388, leaded component 410 in a state with leads 414 facing downwards in the vertical direction is inserted into component reception member 392. By this, as shown in FIG. 7, leaded component 410 is loaded in component receiving member 392 with leads 414 facing vertically downwards. However, only leaded components 410 scattered on component support member 220 in a specified orientation are loaded on component receiving member 392 according to the above procedure.

Figure 9:
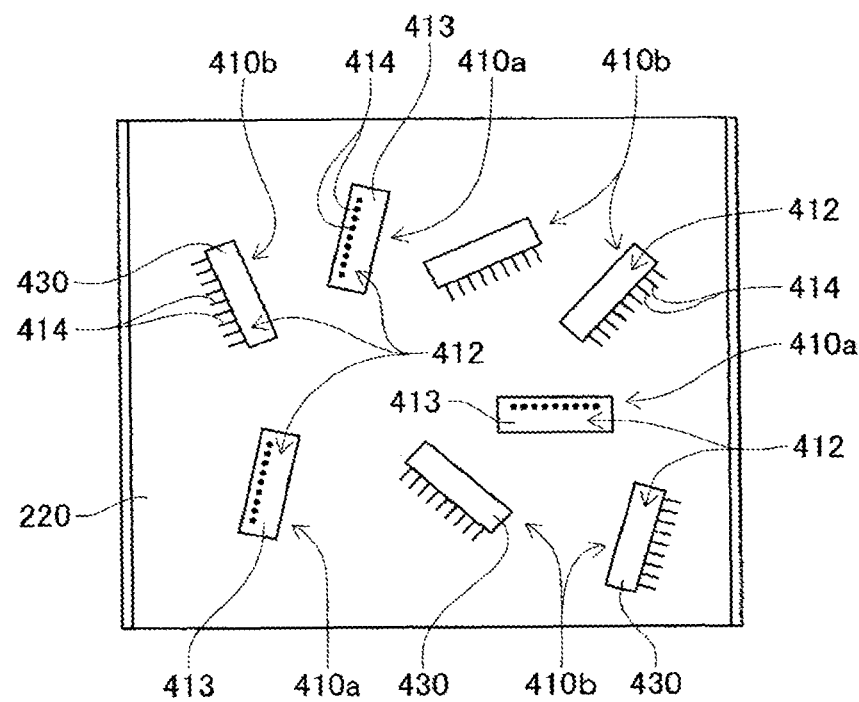
FIG. 9 shows a component support member on which multiple leaded components are scattered.

In detail, as shown in FIG. 9, among the multiple leaded components 410 scattered on component support member 220, there are leaded components 410a in a state with bottom surface 413 from which leads 414 of component main body 412 protrude facing up (hereinafter these are also referred to as "180 degree rotated component"), and leaded components 412b in a state with side surface 430 of component main body 412 facing up (hereinafter these are also referred to as "90 degree rotated components"). Note that, on rare occasions, a leaded component 410 is scattered on component support member 220 with the opposite surface to bottom surface 413 of component main body 412 facing up, that is, with leads 414 contacting the upper surface of component support member 220, but these cases are ignored here.

With 90 degree rotated component 410b scattered on component support member 220, because side surface 430 of component main body 412 is facing up, suction nozzle 332 picks up and holds 90 degree rotated component 410b using side surface 430 of component main body 412. In this case, suction nozzle 332, as described above, is positioned in the non-pivoted position, with the direction of leads 414 of the leaded component 410 being held needing to be adjusted; therefore, suction nozzle 332 is rotated by operation of nozzle rotating device 335. Next, by pivoting suction nozzle 332 to the pivoted position by operation of nozzle pivoting device 334, leads 414 of the leaded component 410 being held are made to face downwards in the vertical direction. Then, suction nozzle 332 is moved above component receiving member 392, and by releasing leaded component 410, leaded component 410 held by suction nozzle 332 is loaded in component reception recess 416 of component receiving member 392, as shown in FIG. 7.

Figure 10:
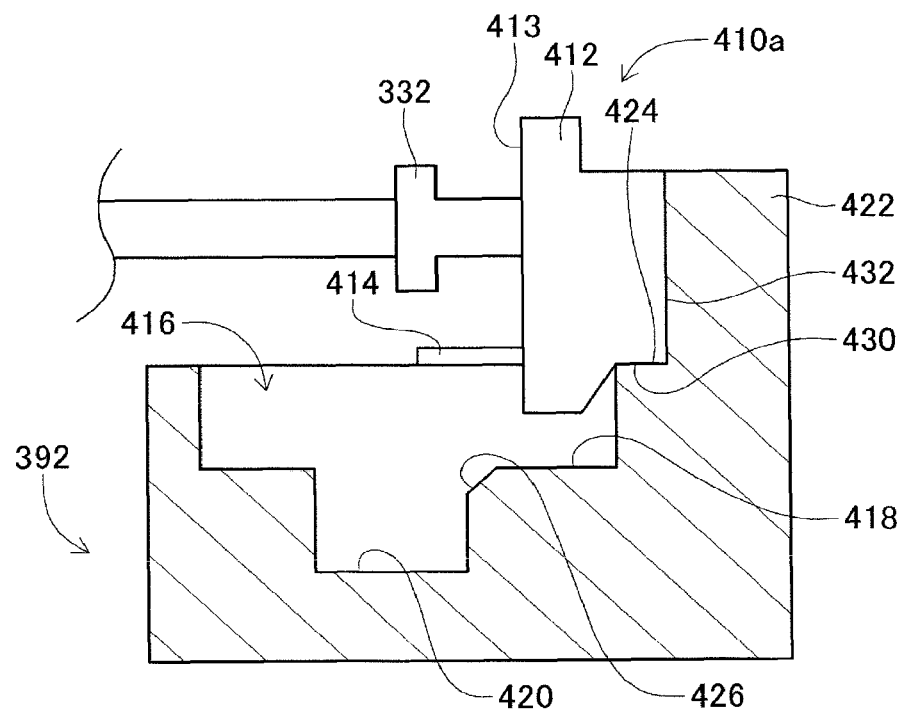
FIG. 10 shows a component receiving member as a leaded component is being stored.

On the other hand, with 180 degree rotated component 410a scattered on component support member 220, as shown in FIG. 9, because bottom surface 413 of component main body 412 is facing up, suction nozzle 332 picks up and holds 180 degree rotated component 410a using bottom surface 413 of component main body 412. Here, suction nozzle 332 is positioned in the non-pivoted position, and in that state leads 414 of 180 degree rotated component 410a being held by suction nozzle 332 are facing up. Then, by pivoting suction nozzle 332 to the pivoted position by operation of nozzle pivoting device 334, as shown in FIG. 10, leads 414 are made to be approximately horizontal. That is, because leads 414 do not face downwards even by suction nozzle 332 being pivoted to the pivoted position, 180 degree rotated components 410a cannot be loaded in component reception recess 416 of component receiving member 392.

Thus, among leaded components 410 scattered on component support member 220, only 90 degree rotated components 410b, that is, only leaded components with side surface 430 of component main body 412 facing up, can be loaded on component receiving member 392 according to the above procedure. Thus, 180 degree rotated component 410a is loaded on component reception recess 416 using side wall section 422, step 424, and tapered surface 426 of component receiving member 392.

In detail, 180 degree rotated component 410a on component support member 220 is held by suction nozzle 332 position in the non-pivoted position, and suction nozzle 332 is pivoted to the pivoted position by operation of nozzle pivoting device 334. Note that, suction nozzle 332 is rotated by operation of nozzle rotating device 335 such that, as shown in FIG. 10, leads 414 of 180 degree rotated component 410a being held by suction nozzle 332 in the pivoted position are positioned below suction nozzle 332. Then, by suction nozzle 332 pivoted to the pivoted position being moved in the left-right direction above component receiving member 392, upper surface 432 that is opposite to bottom surface 413 of 180 degree rotated component 410a being held by suction nozzle 332 contacts side wall section 422 of component receiving member 392. In this case, a portion of side surface 430 of 180 degree rotated component 410a contacts step 424 of component receiving member 392.

Figure 11:
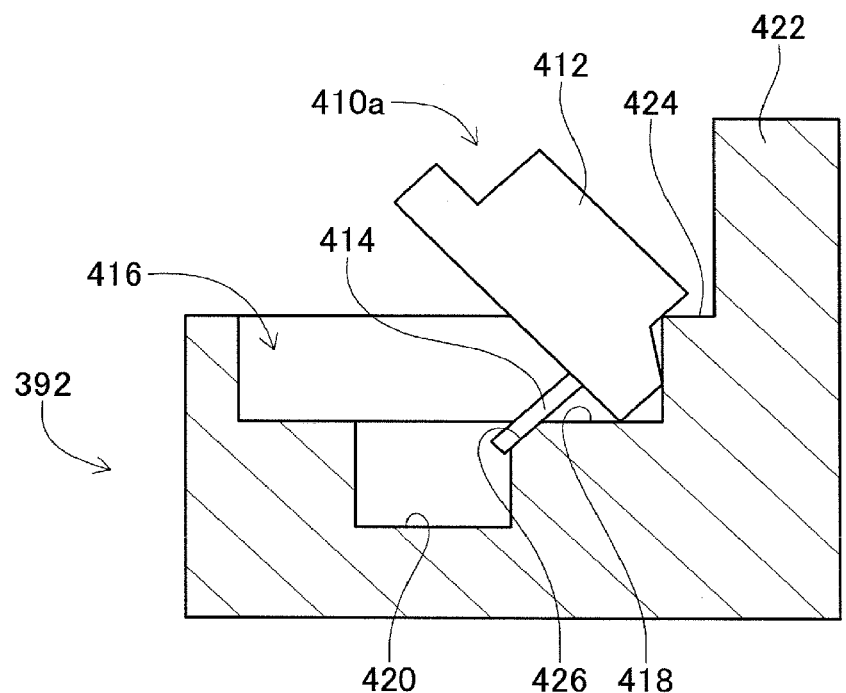
FIG. 11 shows a component receiving member as a leaded component is being stored.

Then, by suction nozzle 332 being separated from 180 degree rotated component 410a, 180 degree rotated component 410a inclines towards component reception recess 416 due to its own weight around side surface 430 that meets the edge of step 424 on the component reception recess 416 side. Here, as shown in FIG. 11, leads 414 of 180 degree rotated component 410a contact tapered surface 426 of component receiving member 392. Thus, 180 degree rotated component 410a falls while rotating due to its own weight. Here, leads 414 of 180 degree rotated component 410a slide along tapered surface 426. By this, leads 414 of 180 degree rotated component 410a, as shown in FIG. 7, are stored inside lead reception recess 420 of component reception recess 416, and component main body 412 of 180 degree rotated component 410a is stored in main body section reception recess 418 of component reception recess 416. Thus, 180 degree rotated component 410a is loaded on component reception recess 416 by being rotated 90 degrees using side wall section 422, step 424, and tapered surface 426 of component receiving member 392. By this, it is possible to store 180 degree rotated component 410a, that is, a leaded component loaded on component support member 220 with bottom surface 413 facing up, inside component reception recess 416 with upper surface 432 facing up by rotating the leaded component 410a by pivoting suction nozzle 332 90 degrees using nozzle pivoting device 334 and rotating 180 degree rotated component 410a by 90 degrees at component receiving member 392.

Figure 12:
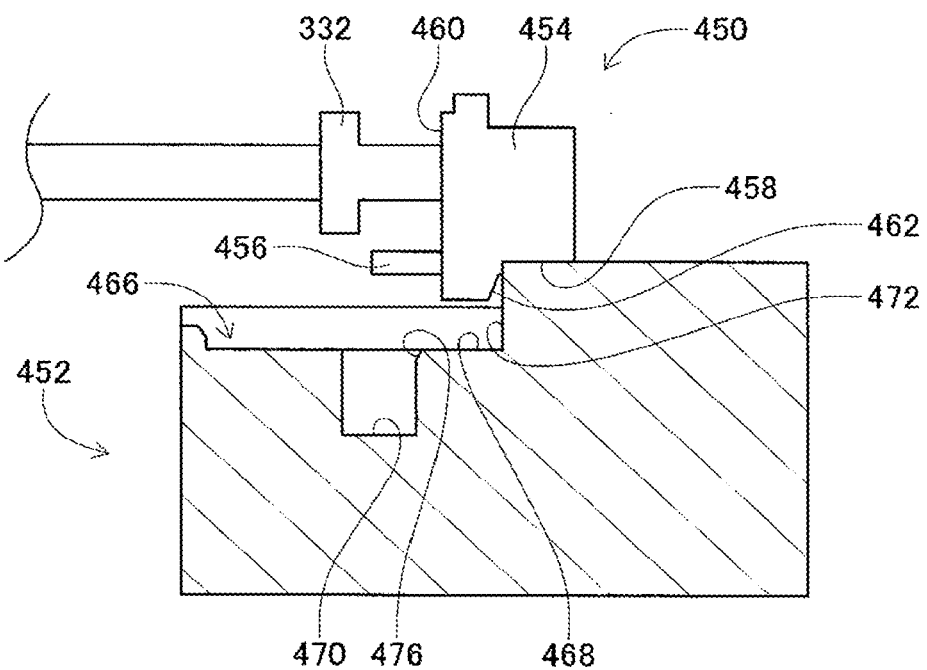
FIG. 12 shows a component receiving member as a leaded component is being stored.

Further, multiple types of component receiving members are prepared for component carrier 388 according to the shapes of leaded components. In detail, when leaded component 450 with a shape shown in FIG. 12 is the pickup target component, leaded component 450 is loaded on component receiving member 452 shaped according to leaded component 450. In detail, leaded component 450 is configured from component main body 454 and leads 456, and inclined surface 462 that inclines towards bottom surface 460 is formed on a central portion of side surface 458 of component main body 454.

On the other hand, component reception recess 466 is formed on component receiving member 452. Component reception recess 466 is a stepped recess configured from main body section reception recess 468 open at the top surface of component receiving member 452, and lead reception recess 470 open at the bottom surface of main body section reception recess 468. Also, single side surface 472 that demarcates main body section reception recess 468 has a length about twice the dimension of the depth of main body section reception recess 468. That is, the single side surface 472 protrudes further upwards than other side surfaces that demarcate main body section reception recess 468. Further, tapered surface 476 is formed on the edge of lead reception recess 470 on the side surface 472 side as a continuation of main body section reception recess 468, with tapered surface 476 being inclined towards the bottom surface of lead reception recess 470.

When leaded component 450 scattered on component support member 220 with bottom surface 460 facing up is loaded on component receiving member 452 with a shape as given above, in a similar manner to 180 degree rotated component 410a, leaded component 450 on component support member 220 is held by suction nozzle 332 positioned in the non-pivoted position, and suction nozzle 332 is pivoted to the pivoted position by operation of nozzle pivoting device 334. Note that, suction nozzle 332 is rotated by operation of nozzle rotating device 335 such that, as shown in FIG. 12, leads 456 of leaded component 450 being held by suction nozzle 332 in the pivoted position are positioned below suction nozzle 332. Then, by suction nozzle 332 pivoted to the pivoted position being moved in the left-right direction above component receiving member 452, the portion of side surface 458 of leaded component 450 held by suction nozzle 332 that connects to inclined surface 462 contacts side surface 472 of component receiving member 452.

Figure 13:
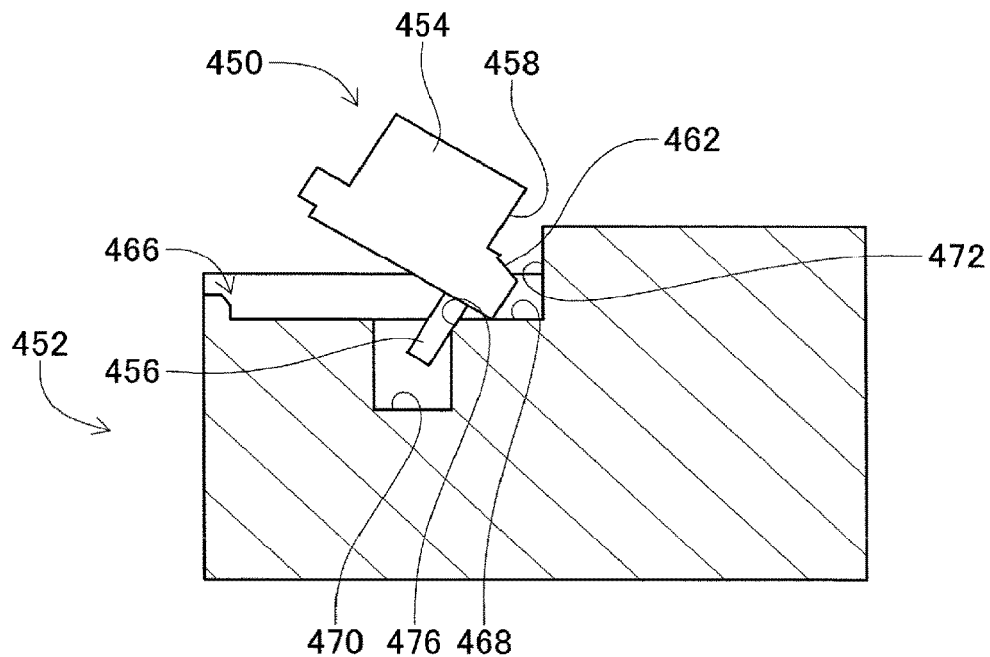
FIG. 13 shows a component receiving member as a leaded component is being stored.
Figure 14:
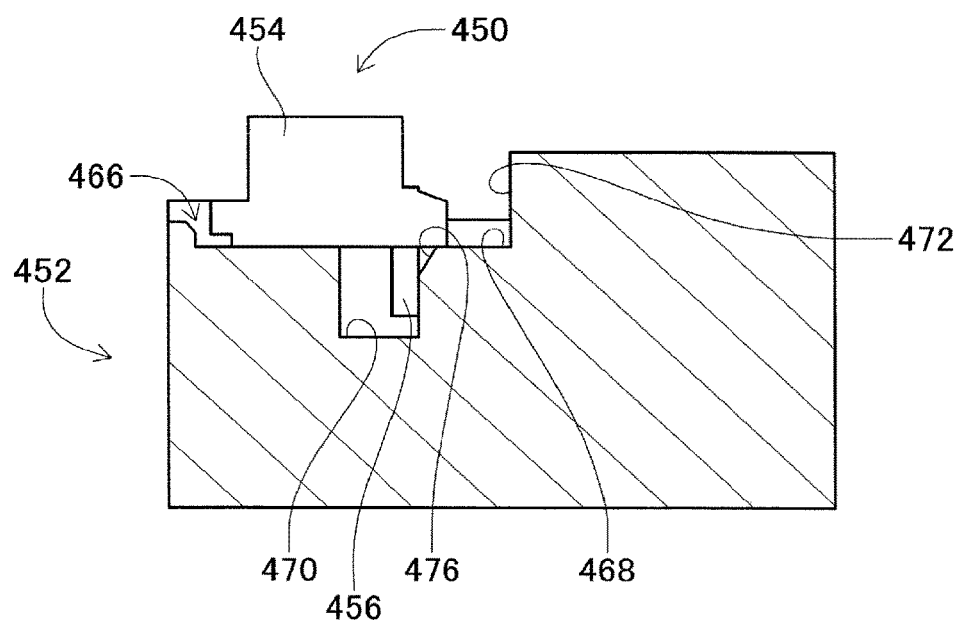
FIG. 14 shows a component receiving member in which is stored a leaded component.

Then, by suction nozzle 332 being separated from leaded component 450, leaded component 450 inclines towards component reception recess 466 due to its own weight around the portion of side surface 458 that connects to inclined surface 462. Here, leads 456 of leaded component 450, as shown in FIG. 13, contact tapered surface 476 of component receiving member 452. Subsequently, leaded component 450 further falls while rotating due to its own weight. Here, leads 456 of leaded component 450 slide along tapered surface 476. By this, leads 456 of leaded component 450, as shown in FIG. 14, are stored inside lead reception recess 470 of component reception recess 466, and component main body 454 of leaded component 450 is stored in main body section reception recess 468 of component reception recess 466. In this manner, with component carrier 388, component receiving members 392 and 452 with a shape according to leaded components 410 and 450 are prepared, and leaded components 410 and 450 are loaded on component receiving members 392 and 452 with a shape according to the respective leaded components.

Also, when leaded components 410 and 450 are loaded on component receiving members 392 and 452 with a shape according to the respective leaded components, component carrier 388 is moved to the component supply position by operation of component carrier moving device 390. With loose component supply device 32, because component carrier 388 moved to the component supply position is within the movement range of work heads 60 and 62, leaded components 410 are supplied at this position. In this manner, with loose component supply device 32, leaded components 410 are supplied with leads 414 pointing downwards, and with the surface opposite the surface to which the leads are connected facing upwards. Therefore, component holding tool 66 of work head 60 or 62 is able to appropriately hold leaded component 410.

(b) Collection of Leaded Components

Figure 15:
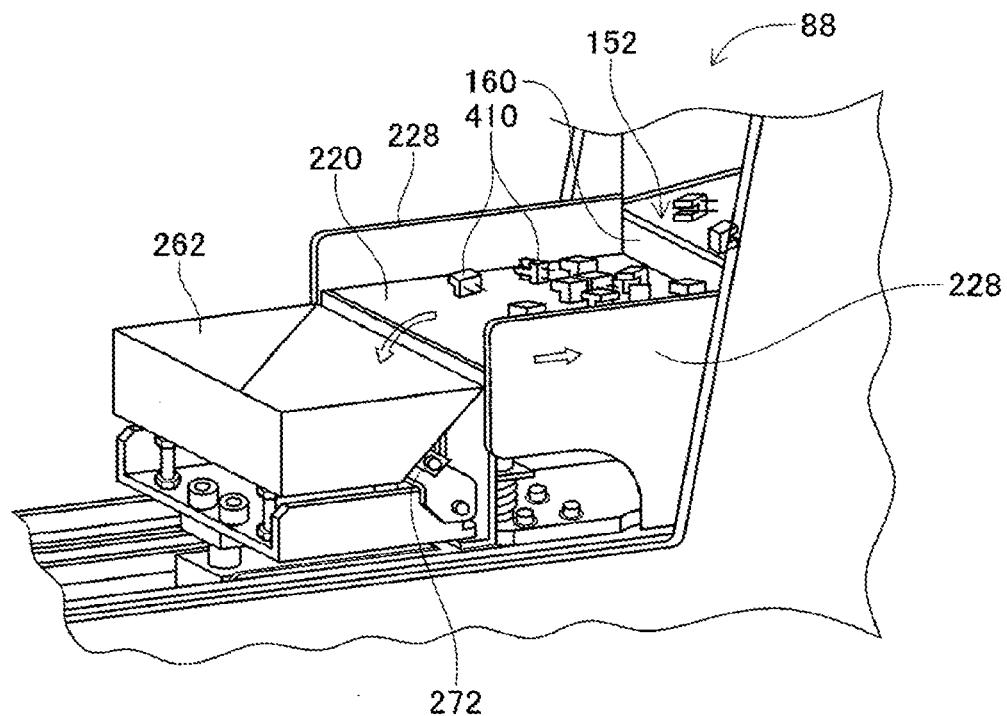
FIG. 15 is a perspective view of a component scattering device and a component returning device.

Further, with loose component supply device 32, leaded components 410 scattered on component support member 220 can be collected. In detail, component support member 220 is moved below component supply apparatus 88 by operation of component support member moving device 222. Here, as shown in FIG. 15, leaded components 410 on component support member 220 are stopped by inclined plate 152 of component supply apparatus 88, such that leaded components 410 on component support member 220 are scraped into component collection container 262.

Next, component collection container 262 is raised by operation of container raising and lowering device 260. Here, as shown in FIG. 5, protruding pin 272 provided on component collection container 262 engages with engaging block 274 provided on the inside of side frame section 190. By this, component collection container 262 is rotated and leaded components 410 inside component collection container 262 are returned inside component storage apparatus 100.

Note that, with loose component supply device 32, as described above, 180 degree rotated components 410a and 90 degree rotated components scattered on component support member 220 are picked up by suction nozzle 332. Therefore, the quantity of leaded components 410 returned to component storage apparatus 100 is reduced.

By an operator gripping the grip of component supply apparatus 88, as described above, component supply apparatus 88 is unlocked, and by the operator raising component supply apparatus 88, component supply apparatus 88 is removed from the pair of side frame sections 190. By this, leaded components 410 are collected from component supply apparatus 88 outside of loose component supply device 32.

Figure 16:
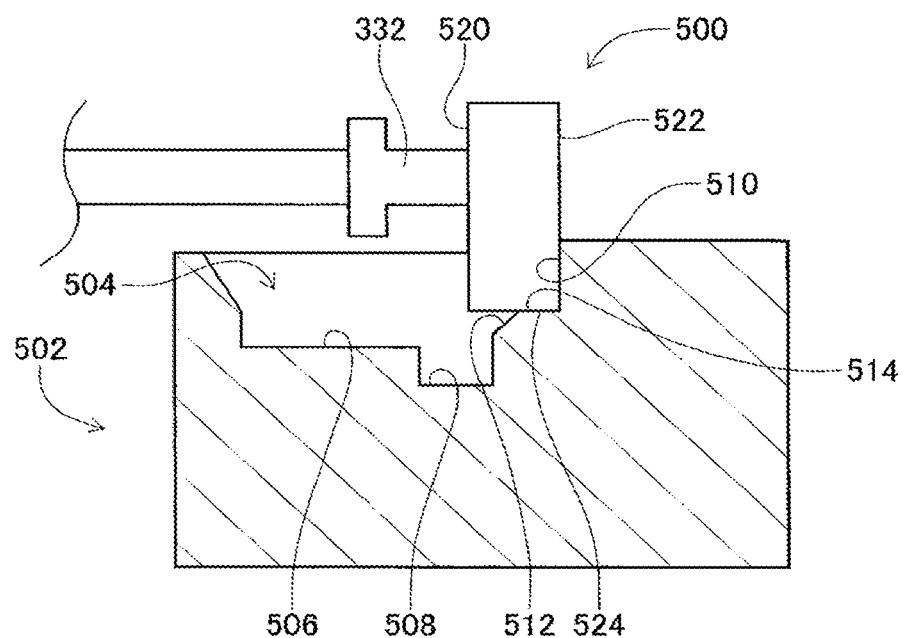
FIG. 16 shows a component receiving member as an electronic component is being stored.

Further, the present disclosure is not limited to the above example embodiments, and various changed or improved methods of embodiment are possible based on the knowledge of someone skilled in the art. Specifically, for example, in the above embodiment, leaded components 410 and 450 with leads 414 and 456 are loaded on component receiving members 392 and 452, but an electronic component without leads may also be loaded on a component receiving member. Specifically, for example, when electronic component 500 with a shape shown in FIG. 16 is the pickup target component, electronic component 500 is loaded on component receiving member 502 shaped according to electronic component 500. Component reception recess 504 is formed in component receiving member 502. Component reception recess 504 is a stepped recess configured from main body section reception recess 506 open at the top surface of component receiving member 502, and recess 508 open at the bottom surface of main body section reception recess 506. Also, single side surface 510 that demarcates main body section reception recess 506 is longer than the depth dimension of main body section reception recess 506. That is, the single side surface 510 protrudes further upwards than other side surfaces that demarcate main body section reception recess 506. Also, tapered surface 512 is formed on the edge of recess 508 on the side surface 510 side, tapered surface 512 being inclined towards the bottom surface of recess 508. Further, step surface 514 is formed between tapered surface 512 and side surface 510.

When electronic component 500 scattered on component support member 220 with bottom surface 520 facing up is loaded on component receiving member 502 with a shape as given above, in a similar manner to 180 degree rotated component 410a, electronic component 500 on component support member 220 is held by suction nozzle 332 positioned in the non-pivoted position, and suction nozzle 332 is pivoted to the pivoted position by operation of nozzle pivoting device 334. By this, bottom surface 520 of electronic component 500 being held by suction nozzle 332 is oriented extending in a vertical direction.

Then, by suction nozzle 332 pivoted to the pivoted position being moved in the left-right direction above component receiving member 502, upper surface 522 that is opposite to bottom surface 520 of electronic component 500 being held by suction nozzle 332 contacts side wall 510 of component receiving member 502. Here, side surface 524 of electronic component 500 contacts step surface 514 of component receiving member 502.

Figure 17:
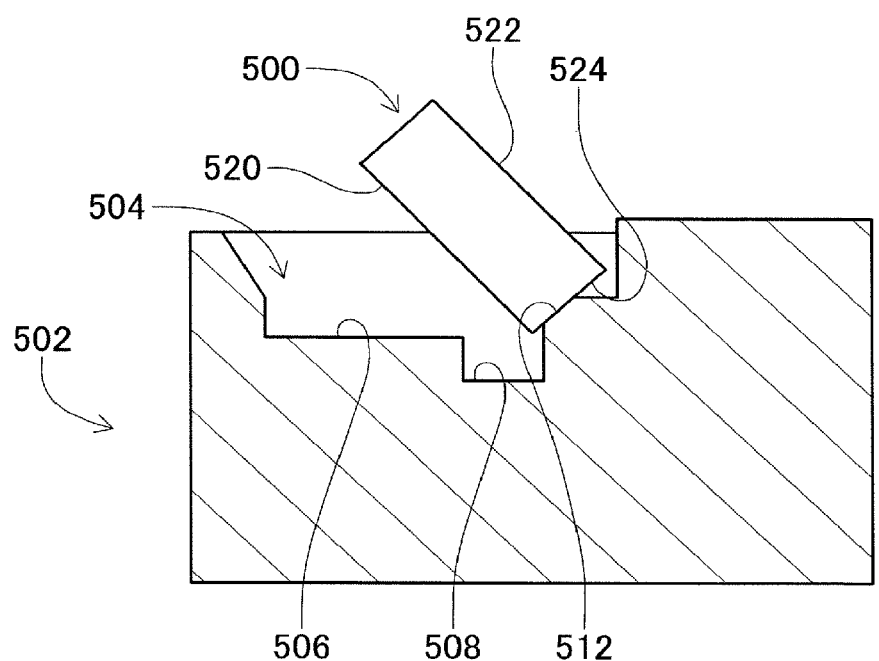
FIG. 17 shows a component receiving member as an electronic component is being stored.
Figure 18:
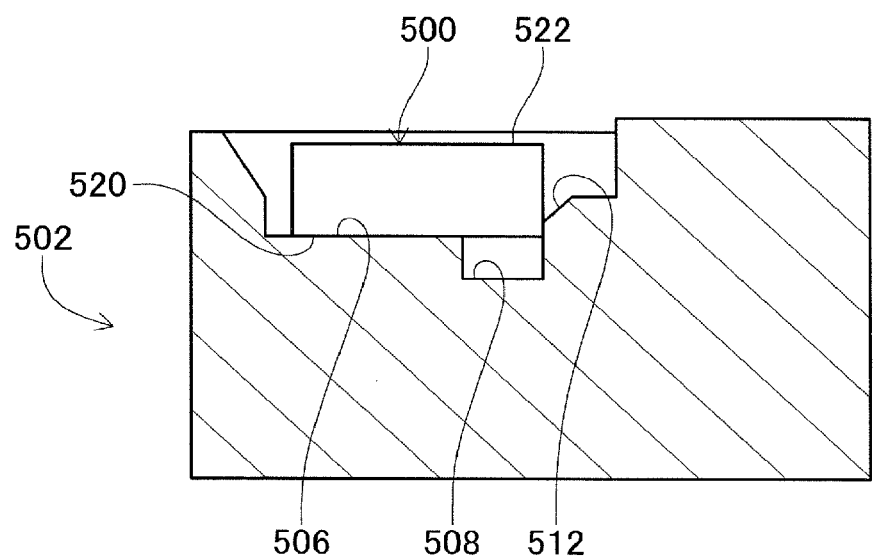
FIG. 18 shows a component receiving member in which is stored an electronic component.

Then, by suction nozzle 332 being separated from electronic component 500, electronic component 500 inclines towards component reception recess 504 due to its own weight around side surface 524 where tapered surface 512 and step surface 514 meet. Here, side surface 524 of electronic component 500, as shown in FIG. 17, contacts tapered surface 512 of component receiving member 502. Subsequently, electronic component 500 further falls while rotating due to its own weight. Here, side surface 524 of electronic component 500 slides along tapered surface 512 and an angled section of side surface 524 of electronic component 500 enters into recess 508 of component reception recess 504. Then, by electronic component 500 rotating further around the angled section, electronic component 500, as shown in FIG. 18, is stored in main body section reception recess of component reception recess 504. As such, even for electronic component 500 without leads, by pivoting suction nozzle 332 90 degrees using nozzle pivoting device 334 and rotating electronic component 500 by 90 degrees at component receiving member 502, electronic component 500 can be stored in component reception recess 504 in a state rotated 180 degrees from the state in which electronic component 500 was loaded on component support member 220, that is, electronic component 500 can be stored in a state flipped in the vertical direction.

Further, in the above embodiment, the present disclosure is applied to component transfer device 86 with a configuration that pivots suction nozzle 332 using nozzle pivoting device 334, but the present disclosure may be applied even for a device with a configuration that does not pivot a suction nozzle. In detail, for example, with a device configured such that suction nozzle is not pivoted, in a case in which 90 degree rotated component 410b (refer to FIG. 9) is scattered on component support member 220, side surface 430 of 90 degree rotated component 410b is used for pickup. Then, in that state, suction nozzle 332 holding 90 degree rotated component 410b is moved above component receiving member 392. Then, when suction nozzle 332 is moved in the left-right direction, upper surface 432 of 90 degree rotated component being held by suction nozzle 332, as shown in FIG. 10, contacts side wall section 422 of component receiving member 392. Here, by suction nozzle 332 separating from 90 degree rotated component 410b, 90 degree rotated component 410b rotates 90 degrees and, as shown in FIG. 7, is stored in component reception recess 416. In this manner, the present disclosure can be applied to a device configured such that a suction nozzle is not pivoted.

Also, in the above embodiment, leaded component 410 is rotated 90 degrees at component receiving member 392 using tapered surface 476, but instead of a tapered surface, a protrusion, a recess, a step, and so on may be used, such that leaded component 410 is rotated 90 degrees at component receiving member 392.

REFERENCE SIGNS LIST

220: component support member (loading stand); 332: suction nozzle (component holding tool); 334: nozzle pivoting device (pivoting mechanism); 392: component receiving member (component storage member); 410: leaded component (component); 416: component reception recess (storage recess); 422: side wall section (contacting section); 426: tapered surface; 450: leaded component (component); 452: component receiving member (component storage member); 466: component reception recess (storage recess); 472: side surface (contacting section); 47: tapered surface; 500: electronic component (component); 502: component receiving member (component storage member); 504: component reception recess (storage recess); 510: side surface (contacting section); 512: tapered surface

The invention claimed is:
1. A storage method of storing a component in a component storage member provided with a storage recess shaped corresponding to the component that is a target for storage, the storage method comprising:
 holding the component with a component holding tool, the component being loaded on a loading stand in a state with a specified surface being contacted;
 pivoting the component held by the component holding tool by 90 degrees in a vertical direction using a pivoting mechanism of the component holding tool;
 contacting the specified surface of the component held by the component holding tool against a contacting member, the contacting member being perpendicular to a bottom surface of the storage recess of the component storage member; and
 storing the component in the storage recess with the specified surface facing up after rotating the component 90 degrees due to its own weight by releasing the holding of the component by the component holding tool in a state with the contacting section contacting the specified surface such that the component falls along at least a portion of a surface from the contacting member to the bottom surface of the storage recess.

2. A storage method of storing a component in a component storage member provided with a storage recess shaped corresponding to the component that is a target for storage, the storage method comprising:
 holding the component with a component holding tool, the component being loaded on a loading stand in a state with a specified surface being contacted;

pivoting the component held by the component holding tool using a pivoting mechanism of the component holding tool;

contacting the specified surface of the component held by the component holding tool against a contacting member; and storing the component in the storage recess with the specified surface facing up after rotating the component due to its own weight by releasing the holding of the component by the component holding tool in a state with the contacting section contacting the specified surface such that the component falls along at least a portion of a surface from the contacting member to the bottom surface of the storage recess.

3. A storage method of storing a component in a component storage member provided with a storage recess shaped corresponding to the component that is a target for storage, the storage method comprising:

holding the component with a component holding tool, the component being loaded on a loading stand in a state with a specified surface being contacted;

pivoting the component held by the component holding tool using a pivoting mechanism of the component holding tool;

contacting the specified surface of the component held by the component holding tool against a contacting member, the contacting member being a predetermined angle to a bottom surface of the storage recess of the component storage member; and storing the component in the storage recess with the specified surface facing up after rotating the component due to its own weight by releasing the holding of the component by the component holding tool in a state with the contacting section contacting the specified surface such that the component falls along at least a portion of a surface from the contacting member to the bottom surface of the storage recess.

* * * * *